US012588401B2

(12) United States Patent
Du et al.

(10) Patent No.: US 12,588,401 B2
(45) Date of Patent: Mar. 24, 2026

(54) DISPLAY PANEL AND DISPLAY DEVICE

(71) Applicant: WUHAN CHINA STAR OPTOELECTRONICS SEMICONDUCTOR DISPLAY TECHNOLOGY CO., LTD., Wuhan (CN)

(72) Inventors: Minchen Du, Wuhan (CN); Shaojing Wu, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 399 days.

(21) Appl. No.: 18/250,995

(22) PCT Filed: Mar. 1, 2023

(86) PCT No.: PCT/CN2023/079149
§ 371 (c)(1),
(2) Date: Apr. 28, 2023

(87) PCT Pub. No.: WO2024/168949
PCT Pub. Date: Aug. 22, 2024

(65) Prior Publication Data

US 2024/0349581 A1 Oct. 17, 2024

(30) Foreign Application Priority Data

Feb. 17, 2023 (CN) ........................ 202310131779.X

(51) Int. Cl.
*H10K 59/131* (2023.01)
*H10K 59/88* (2023.01)

(52) U.S. Cl.
CPC ........... *H10K 59/88* (2023.02); *H10K 59/131* (2023.02)

(58) Field of Classification Search
CPC ................. H10K 59/88; H10K 59/131; G09G 2300/0413
See application file for complete search history.

(56) References Cited

U.S. PATENT DOCUMENTS

2008/0179593 A1 7/2008 Lim et al.
2021/0043710 A1 2/2021 Yun
2023/0063317 A1* 3/2023 Cho ..................... H10K 59/131

FOREIGN PATENT DOCUMENTS

CN 113327516 A 8/2021
CN 113345931 A 9/2021
(Continued)

OTHER PUBLICATIONS

International Search Report in International application No. PCT/CN2023/079149, mailed on Nov. 1, 2023.
(Continued)

*Primary Examiner* — Kevin M Nguyen
(74) *Attorney, Agent, or Firm* — PV IP PC; Peter S. Stecher; Wei Te Chung

(57) ABSTRACT

The present application provides a display panel and a display device. The display panel comprises a plurality of dummy lines, a plurality of first data lines and a plurality of fan-out lines electrically connected to a plurality of the first data lines in the active area. A plurality of the dummy lines include a plurality of first dummy lines being alternately spaced from a plurality of first data lines and a plurality of second dummy lines being disposed on extension lines of a plurality of fan-out lines, so as to improve the distribution
(Continued)

density of wirings in the active area, thereby improving the problem of uneven display when the display panel is power off.

16 Claims, 9 Drawing Sheets

(56) References Cited

FOREIGN PATENT DOCUMENTS

| | | | |
|---|---|---|---|
| CN | 115050340 | A | 9/2022 |
| CN | 115188792 | A | 10/2022 |
| CN | 115244706 | A | 10/2022 |
| CN | 115274708 | A | 11/2022 |
| CN | 115472657 | A | 12/2022 |
| WO | 2023284046 | A1 | 1/2023 |

OTHER PUBLICATIONS

Written Opinion of the International Search Authority in International application No. PCT/CN2023/079149, mailed on Nov. 1, 2023.

Chinese Office Action issued in corresponding Chinese Patent Application No. 202310131779.X dated Jul. 17, 2025, pp. 1-10.

* cited by examiner

DISPLAY PANEL AND DISPLAY DEVICE

CROSS-REFERENCE TO RELATED APPLICATIONS

This application is a national stage of International Application No. PCT/CN2023/079149, filed on Mar. 1, 2023, which claims priority to Chinese Patent Application No. 202310131779.X, filed on Feb. 17, 2023. Both of the aforementioned applications are hereby incorporated by reference in their entireties.

TECHNICAL FIELD

The present application relates to the technical field of display, in particular to a display panel and a display device.

BACKGROUND

Although the Fan-out In Active Area (FIAA) technology can reduce the width of the lower frame to a certain extent, it has the problems of many processes involved, complex wirings arrangement and high manufacturing cost. Therefore, in order to reduce the cost and simplify the wirings design with the signal transmission effect unchanged, a same metal (such as SD1) can be selected for the power lines and data lines disposed in the active area for wiring design, another metal (such as SD2) can be selected for the fan-out wirings disposed in the active area and introduced by the driving chip terminal for wiring design along the horizontal and vertical direction. However, the problem of uneven display when the display panel is power off will appear after the product is produced as cell or module due to uneven distribution of metal patterns.

SUMMARY OF THE INVENTION

Technical Problem

The embodiments of the present application provide a display panel and a display device, which can improve the problem of uneven display when the display panel is power off.

Technical Solution

The embodiments of the present application provide a display panel, including an active area, the display panel further includes: a plurality of data lines disposed in the active area and including a plurality of first data lines; and a plurality of fan-out lines disposed in the active area and being electrically connected to a plurality of the first data lines; wherein the display panel further includes a plurality of dummy lines being disposed in the active area, the dummy lines include a plurality of first dummy lines being alternately spaced from a plurality of the first data lines and a plurality of second dummy lines being disposed on extension lines of a plurality of the fan-out lines.

Optionally, in some embodiments of the present application, each of the fan-out lines includes a first sub line and a second sub line electrically connected to the first sub line, and a plurality of the dummy lines includes a plurality of first sub dummy lines and a plurality of second sub dummy lines; wherein the first sub lines extend along a first direction, the second sub lines extend along a second direction intersecting the first direction, each of the first sub dummy lines being disposed on an extension line of the corresponding first sub line, and each of the second sub dummy lines being disposed on an extension line of the corresponding second sub line.

Optionally, in some embodiments of the present application, a plurality of the data lines further includes a plurality of second data lines, and a plurality of the second data lines being alternately spaced from a plurality of the second sub dummy lines.

Optionally, in some embodiments of the present application, the display panel includes: a first metal layer including a plurality of data lines, a plurality of second sub lines, a plurality of first dummy lines and a plurality of second sub dummy lines; and a second metal layer disposed at one side of the first metal layer and including a plurality of the first sub lines and a plurality of the first sub dummy lines.

Optionally, in some embodiments of the present application, the active area includes a main active area and a first active area, a second active area and a third active area being disposed on one side of the main active area, the second active area being disposed between the first active area and the third active area; wherein a plurality of the first data lines and a plurality of the first dummy lines extend from the first active area toward the second active area and the main active area along the second direction, a plurality of the second data lines extend from the third active area toward the second active area and the main active area along the second direction; wherein a plurality of the first sub lines being disposed in the second active area, and a plurality of the second sub lines being disposed in the third active area; wherein a plurality of the first sub dummy lines being disposed in the first active area and the third active area, and a plurality of the second sub dummy lines extend from the second active area toward the main active area along the second direction.

Optionally, in some embodiments of the present application, the second active area includes a first sub active area and a second sub active area adjacent to the first sub active area, the first sub active area being disposed between the second sub active area and the first active area; wherein a plurality of the first data lines and a plurality of the first dummy lines extend from the first active area toward the first sub active area and the main active area along the second direction, a plurality of the second data lines extend from the third active area toward the second sub active area and the main active area along the second direction, a plurality of the second sub dummy lines extend from the second sub active area toward the main active area along the second direction.

Optionally, in some embodiments of the present application, each of the first sub dummy lines disposed in the first active area and the corresponding first sub line form a first interval at a first boundary of the first active area and the second active area, each of the first sub dummy lines disposed in the third active area and the corresponding first sub line form a second interval at a second boundary of the second active area and the third active area, and each of the second sub dummy lines and the corresponding second sub line form a third interval at the second boundary; wherein an included angle pattern formed by the intersection of the first boundary and the second boundary faces to the main active area.

Optionally, in some embodiments of the present application, the display panel further includes: a plurality of first power lines, each of the first power lines being disposed between the first data line and the first dummy line and extends along the second direction; a plurality of second power lines, each of the second power lines being disposed between the second data line and the second sub dummy line and extends along the second direction; and a plurality of first scanning lines disposed in the active area and extending along the first direction; wherein an orthographic projection of each of the first intervals on a corresponding first power line being at least partially overlapped with the first power line, an orthographic projection of each of the second intervals on a corresponding second power line being at least partially overlapped with the second power line, and an orthographic projection of each of the third intervals on a corresponding first scanning line being at least partially overlapped with the first scanning line.

Optionally, in some embodiments of the present application, a plurality of the first dummy lines being electrically connected to the first power supply lines, and a plurality of the second dummy lines being electrically connected to the first power supply lines and the second power supply lines.

Optionally, in some embodiments of the present application, the dummy lines further include a plurality of third dummy lines being disposed in the main active area and extend along the first direction; wherein each of the third dummy lines being partially overlapped with a plurality of the first data lines, a plurality of the second data lines, a plurality of the first dummy lines and a plurality of the second sub dummy lines.

Optionally, in some embodiments of the present application, the first data lines in the first active area farther from the third active area being electrically connected to the second sub lines in the third active area farther from the first active area.

Optionally, in some embodiments of the present application, the display panel further includes: a plurality of sub pixels; and a plurality of pixel driving units electrically connected to a plurality of first power lines, a plurality of second power lines, a plurality of first scanning lines and a plurality of sub pixels; wherein at least one of the first sub lines being disposed between the two adjacent pixel driving units along the second direction.

Optionally, in some embodiments of the present application, at least one of a plurality of the first intervals, a plurality of the second intervals, and a plurality of the third intervals being partially overlapped with a first electrode portion of the sub pixel.

The embodiments of the present application provide a display device, the display device including a driving module and the display panel as claimed in Claim 1, wherein the driving module includes a plurality of output terminals, a plurality of the output terminals being electrically connected to a plurality of the data lines; wherein a plurality of the first data lines being arranged in a first sequence, data signals outputted from a plurality of first output terminals electrically connected to a plurality of the first data lines being arranged in a second sequence, wherein the first sequence being different from the second sequence.

Optionally, in some embodiments of the present application, each of the fan-out lines includes a first sub line and a second sub line electrically connected to the first sub line, and a plurality of the dummy lines includes a plurality of first sub dummy lines and a plurality of second sub dummy lines; wherein the first sub lines extend along a first direction, the second sub lines extend along a second direction intersecting the first direction, each of the first sub dummy lines being disposed on an extension line of the corresponding first sub line, and each of the second sub dummy lines being disposed on an extension line of the corresponding second sub line.

Optionally, in some embodiments of the present application, the display panel includes: a first metal layer including a plurality of the data lines, a plurality of second sub lines, a plurality of first dummy lines and a plurality of second sub dummy lines; and a second metal layer disposed at one side of the first metal layer and including a plurality of the first sub lines and a plurality of the first sub dummy lines.

Optionally, in some embodiments of the present application, the active area includes a main active area and a first active area, a second active area and a third active area being disposed on one side of the main active area, the second active area being disposed between the first active area and the third active area. A plurality of the data lines further includes a plurality of second data lines, and a plurality of the second data lines being alternately spaced from a plurality of the second sub dummy lines. A plurality of the dummy lines further includes a plurality of third dummy lines, a plurality of the third dummy lines being disposed in the main active area, each of the third dummy lines extends along the first direction and being partially overlapped with a plurality of the first data lines, a plurality of the second data lines, a plurality of the first dummy lines and a plurality of the second sub dummy lines.

Wherein a plurality of the first data lines and a plurality of the first dummy lines extend from the first active area toward the second active area and the main active area along the second direction, a plurality of the second data lines extend from the third active area toward the second active area and the main active area along the second direction; wherein a plurality of the first sub lines being disposed in the second active area, and a plurality of the second sub lines being disposed in the third active area; wherein a plurality of the first sub dummy lines being disposed in the first active area and the third active area, and a plurality of the second sub dummy lines extend from the second active area toward the main active area along the second direction.

Optionally, in some embodiments of the present application, each of the first sub dummy lines disposed in the first active area and the corresponding first sub line form a first interval at a first boundary of the first active area and the second active area, each of the first sub dummy lines disposed in the third active area and the corresponding first sub line form a second interval at a second boundary of the second active area and the third active area, and each of the second sub dummy lines and the corresponding second sub line form a third interval at the second boundary; wherein an included angle pattern formed by the intersection of the first boundary and the second boundary faces to the main active area.

Optionally, in some embodiments of the present application, the display panel further includes: a plurality of first power lines, each of the first power lines being disposed between the first data line and the first dummy line and extends along the second direction; a plurality of second power lines, each of the second power lines being disposed between the second data line and the second sub dummy line and extends along the second direction; and a plurality of first scanning lines disposed in the active area and extending along the first direction; wherein an orthographic projection of each of the first intervals on a corresponding first power line being at least partially overlapped with the first power line, an orthographic projection of each of the second intervals on a corresponding second power line being at least partially overlapped with the second power line, and an orthographic projection of each of the third intervals on a corresponding first scanning line being at least partially overlapped with the first scanning line.

Optionally, in some embodiments of the present application, the display panel further includes: a plurality of sub pixels; and a plurality of pixel driving units electrically connected to a plurality of first power lines, a plurality of second power lines, a plurality of first scanning lines and a plurality of sub pixels; wherein at least one of the first sub lines being disposed between the two adjacent pixel driving units along the second direction.

Advantageous Effects

Compared with the prior art, the present application provides a display panel and a display device, the display panel includes a plurality of data lines, a plurality of fan-out lines and a plurality of dummy lines disposed in the active area of the display panel. A plurality of the data lines include a plurality of first data lines, a plurality of the fan-out lines are electrically connected to a plurality of the first data lines. A plurality of the dummy lines includes a plurality of first dummy lines alternately spaced from a plurality of the first data lines and a plurality of second dummy lines disposed on extension lines of a plurality of the fan-out lines. By providing a plurality of the first dummy lines alternately spaced from the first data lines in the active area, and by providing a plurality of the second dummy lines on the extension lines of the fan-out lines, the distribution density of the wirings in the active area is improved, thereby improving the problem of uneven display when the display panel is power off due to uneven distribution of metal patterns.

DETAILED DESCRIPTION OF THE EMBODIMENTS

In order to make the purpose, technical solutions and effects of the present application clearer and more specific, the present application is further described in detail with reference to the accompanying drawings and embodiments. It should be understood that the specific embodiments described herein are used to interpret the present application and not to limit the present application.

Figure 1A:
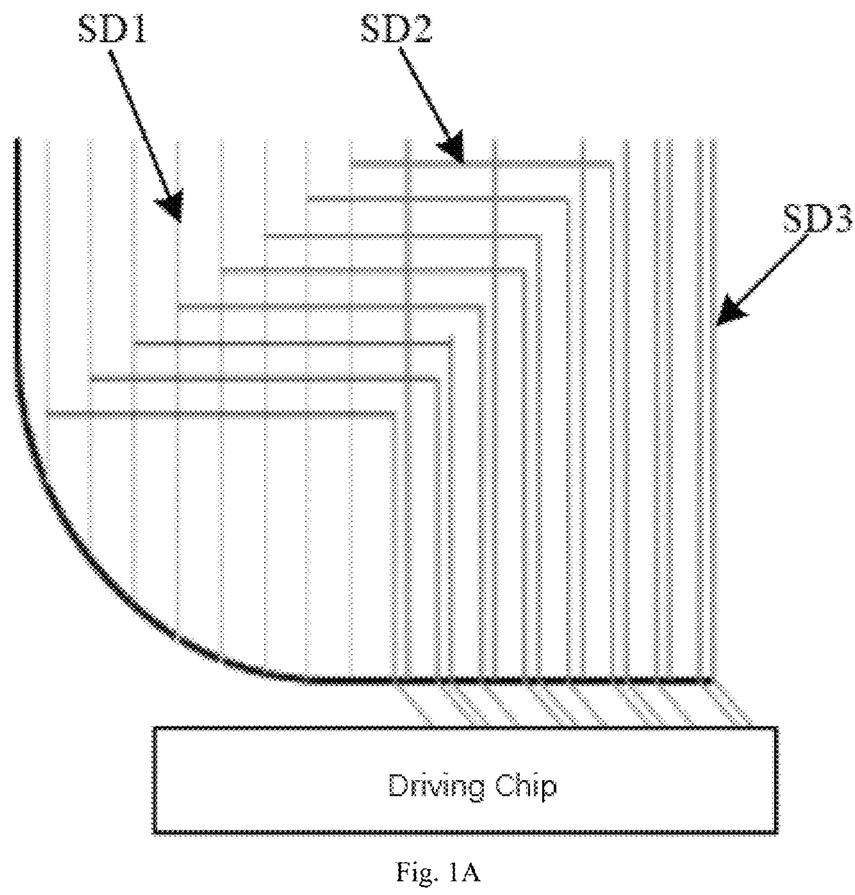
FIG. 1A to FIG. 1B are structural schematic diagrams of fan-out lines in the prior art.
Figure 1B:
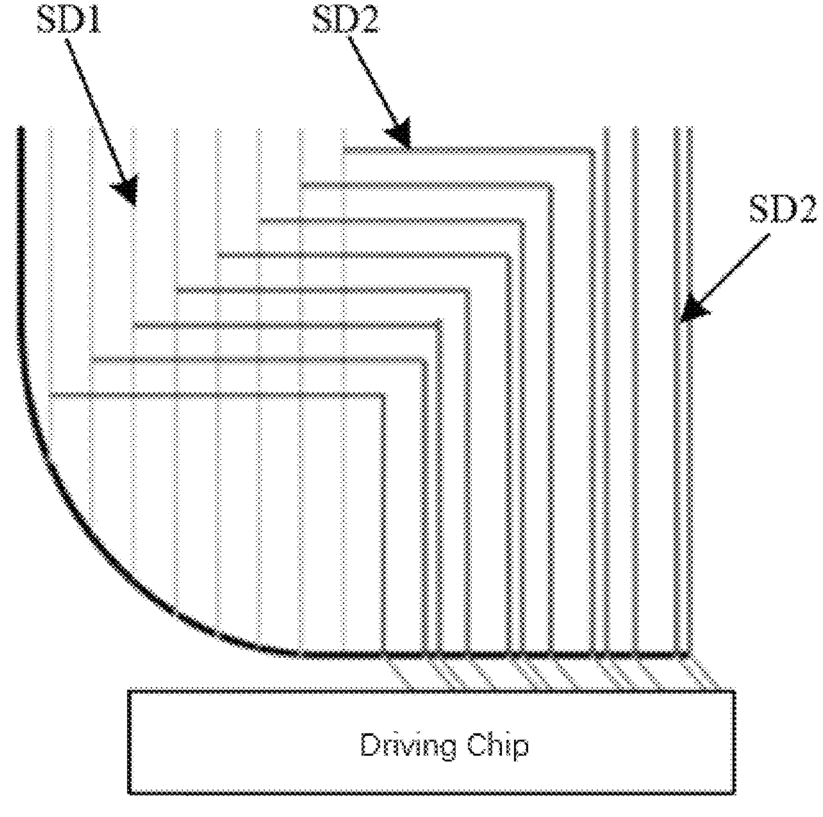

Specifically, FIG. 1A to FIG. 1B are structural schematic diagrams of fan-out lines in the prior art. Refer to FIG. 1A, in the prior art, the fan-out lines are disposed in the active area by using the SD1 (the first metal layer), the SD2 (the second metal layer) and the SD3 (the third metal layer) to realize wirings crossing to transmit the data signals. That is, the data signals outputted by the driving chip are transmitted to the transverse fan-out lines (SD2) through the longitudinal fan-out lines (SD3), and are transmitted to the data lines (SD1) through the transverse fan-out lines (SD2), and are finally transmitted to the corresponding sub pixels through the data lines (SD1). However, since the longitudinal wirings are formed by the SD3, the SD3 and the PLN3 (the third planarization layer) need to be added, which greatly increases the manufacturing cost. Moreover, since the wirings crossing process is complex, it is not conducive to improving the manufacturing efficiency.

Figure 1C:
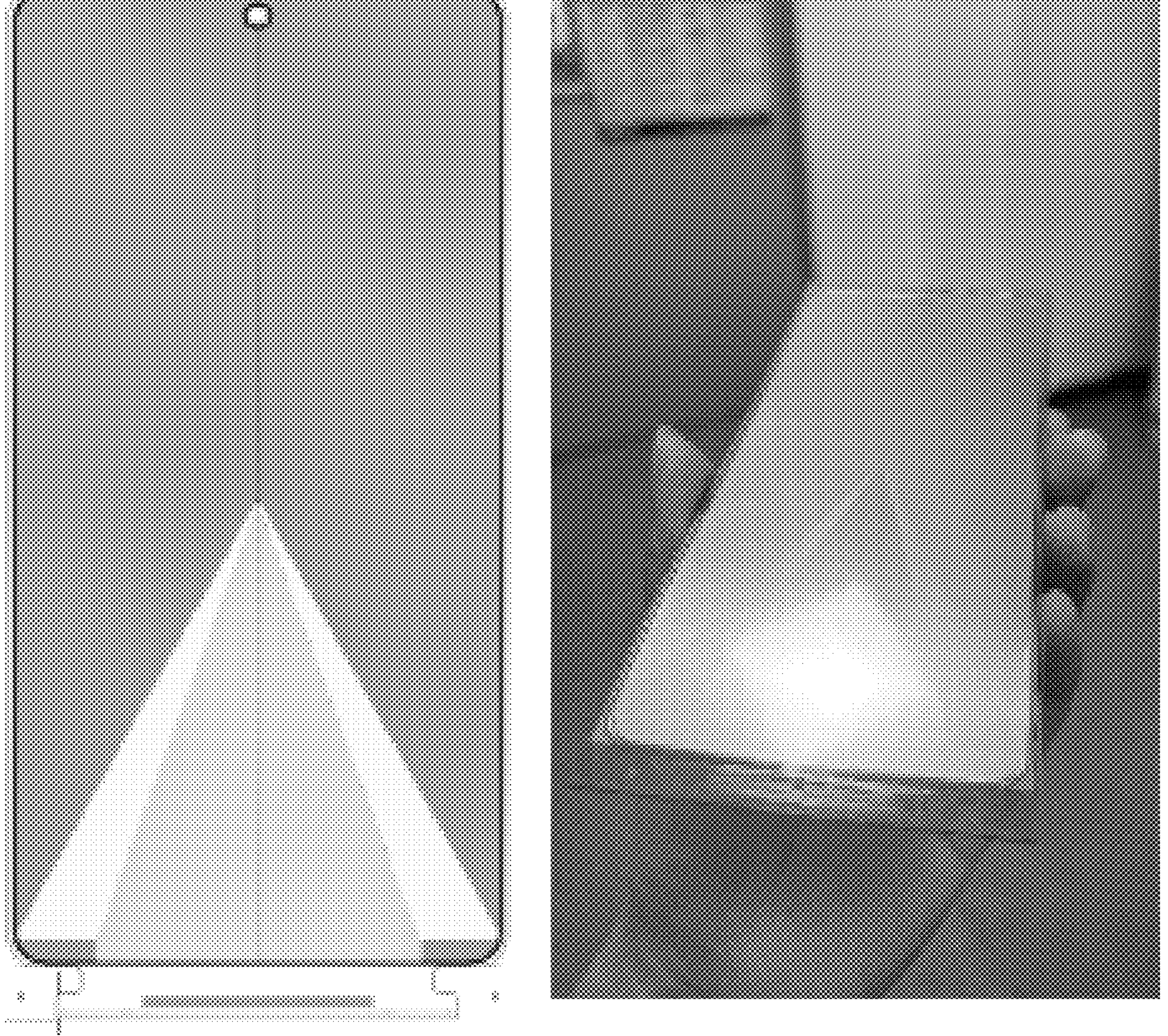
FIG. 1C is a schematic diagram showing an uneven display problem in a display panel in the prior art.

Refer to FIG. 1B, the power lines and the data lines are formed by a same metal layer (such as the SD1), and the transverse and longitudinal fan-out lines electrically connected between the data lines and the driving chips are formed by the SD2, which can reduce the number of wirings crossing, simplify the wirings structure and achieve the same signal transmission effect as shown in FIG. 1A. However, the problem of uneven display when the display panel is power off will appear after the product is produced as a cell or a module due to uneven distribution of metal patterns, as shown in FIG. 1C.

Figure 2A:
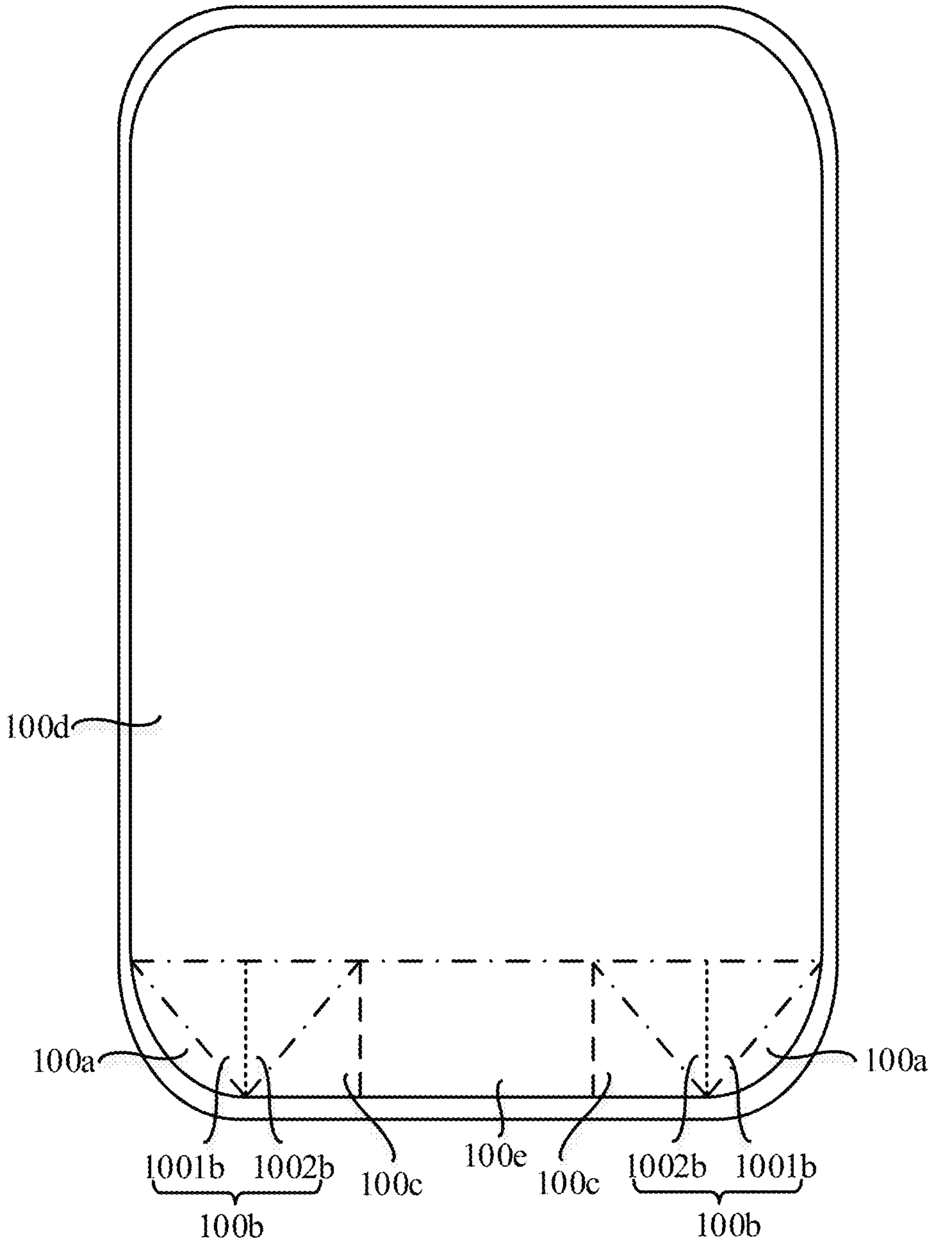
FIG. 2A to FIG. 2B are structural schematic diagrams of the display panel provided in the embodiments of the present application.
Figure 2B:
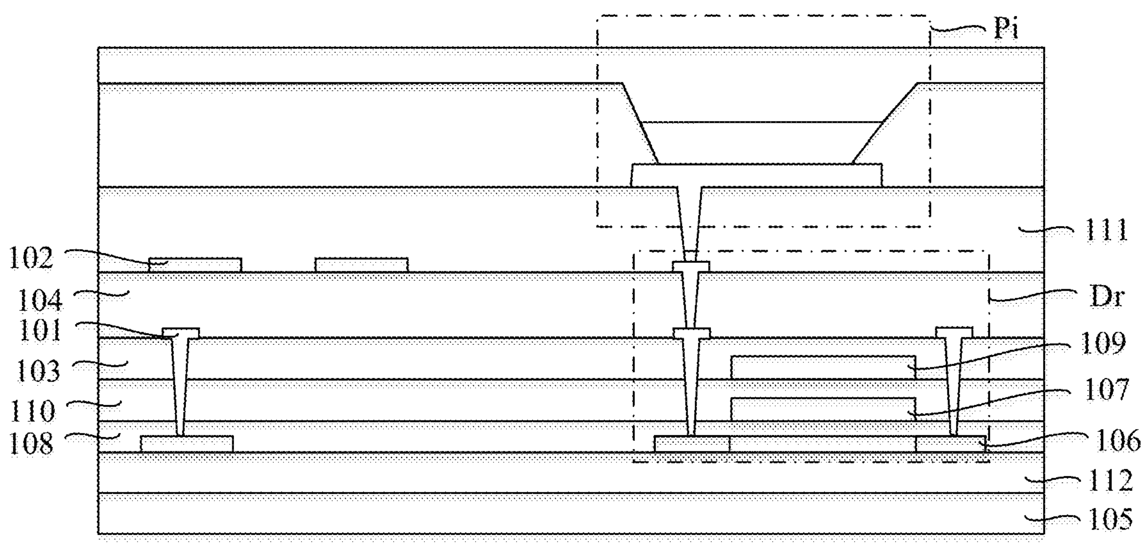
Figure 3A:
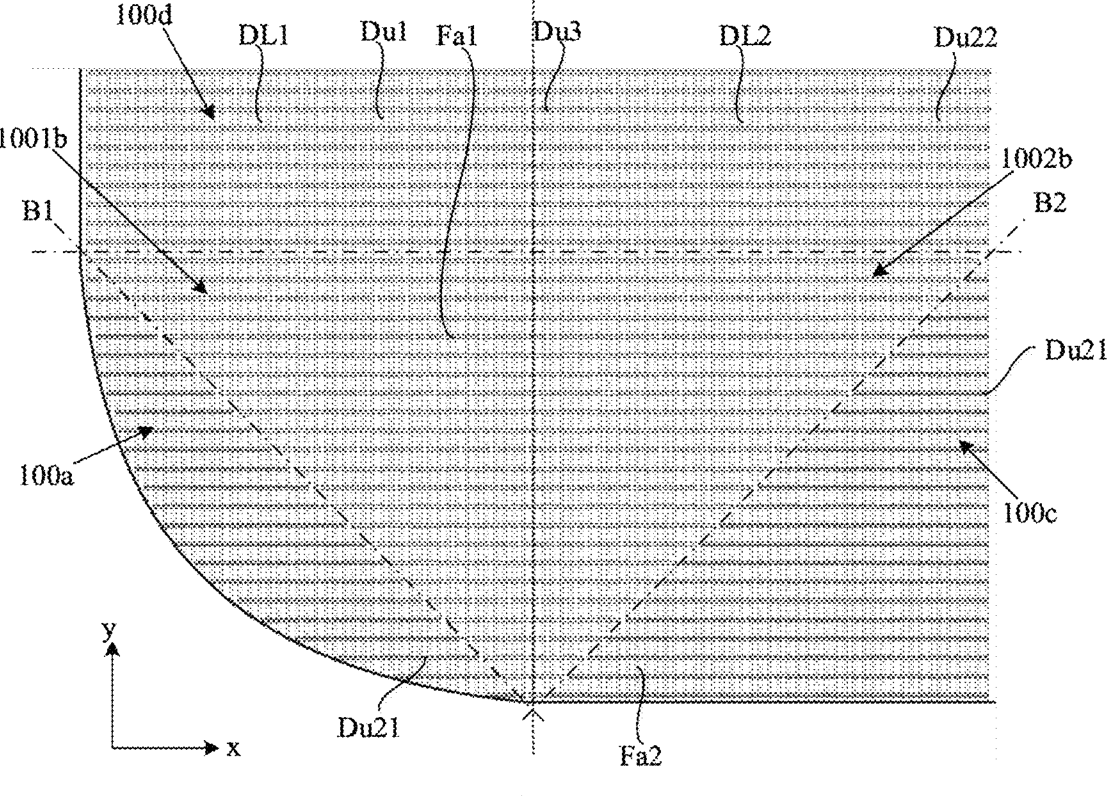
FIG. 3A to FIG. 3C are structural schematic diagrams of fan-out lines, data lines and dummy lines provided in the embodiments of the present application.
Figure 3B:
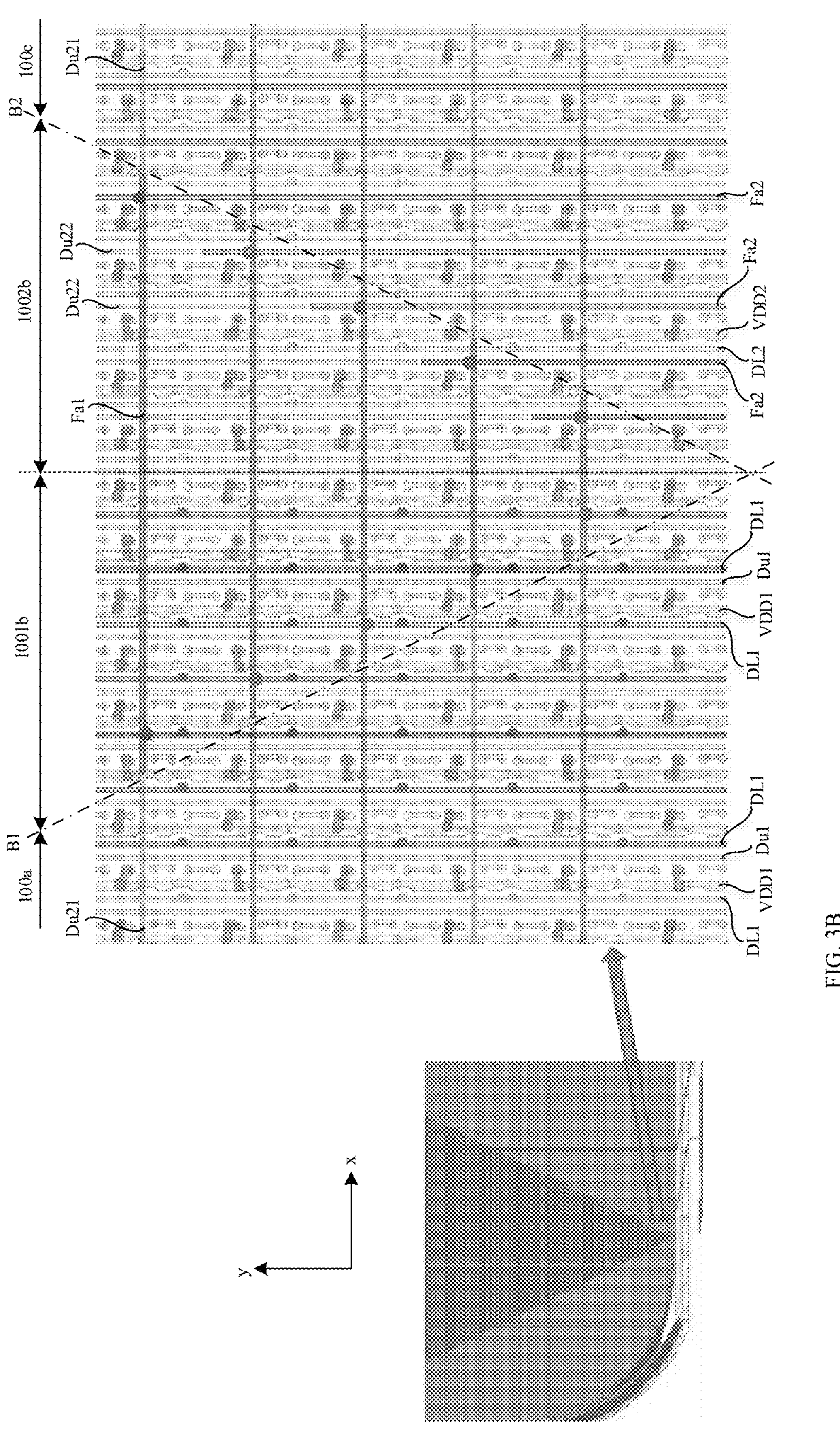
Figure 3C:
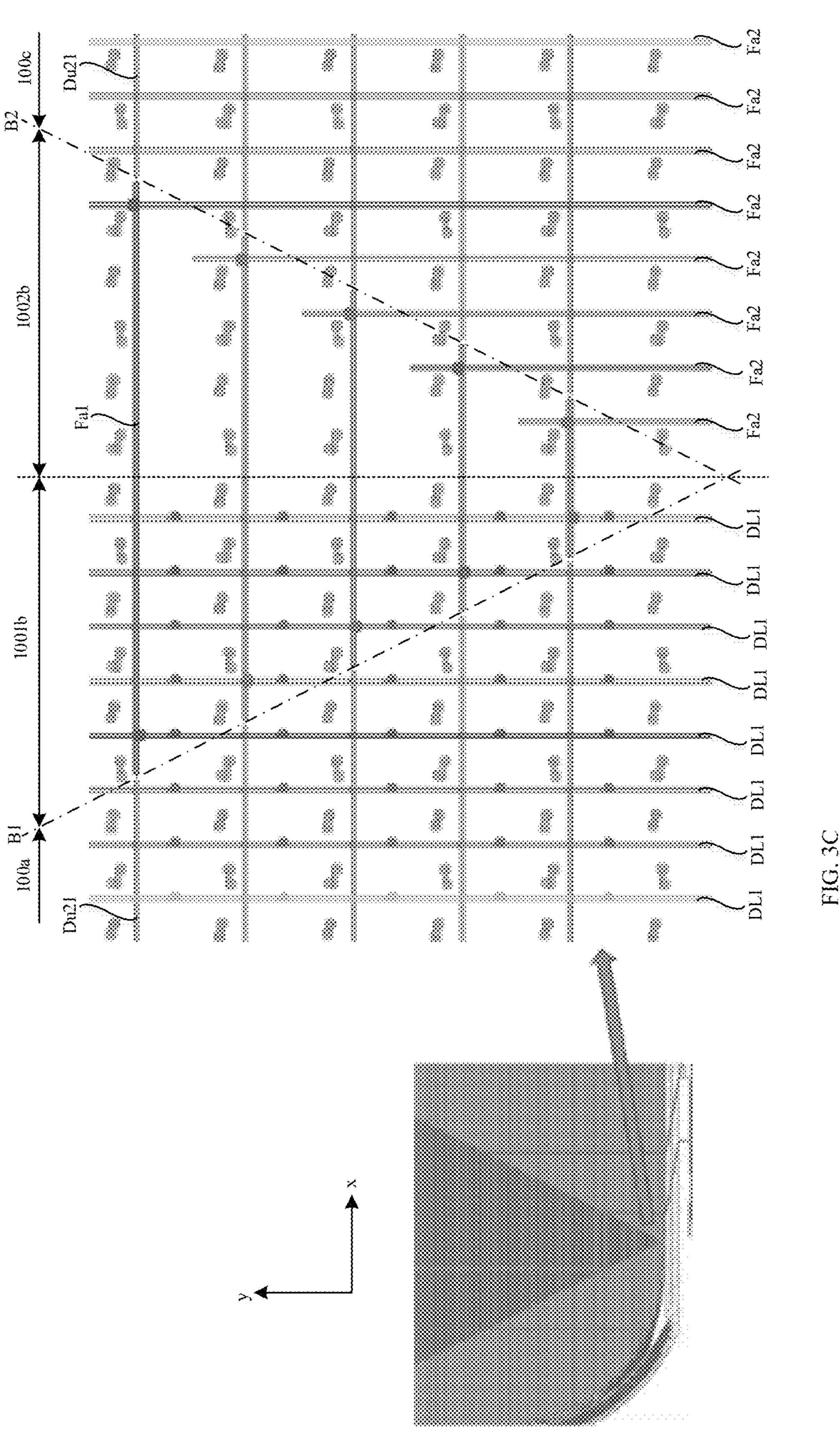

FIGS. 2A to 2B are structural schematic diagrams of the display panel provided in the embodiments of the present application. FIGS. 3A to 3C are structural schematic diagrams of fan-out lines, data lines and dummy lines provided in the embodiments of the present application.

The embodiments of the present application provide a display panel, the display panel includes an active area.

The display panel includes a plurality of data lines, a plurality of fan-out lines and a plurality of dummy lines.

A plurality of the data lines are disposed in the active area, and a plurality of the data lines are configured to transmit a plurality of data signals. A plurality of the data lines include a plurality of first data lines DL1.

A plurality of the fan-out lines are disposed in the active area and are electrically connected to a plurality of the first data lines DL1.

A plurality of the dummy lines are disposed in the active area, and a plurality of the dummy lines include a plurality of first dummy lines Du1 alternately spaced from a plurality of the first data lines DL1 and a plurality of second dummy lines disposed on extension lines of a plurality of the fan-out lines.

By disposing a plurality of first dummy lines Du1 alternately spaced from the first data lines DL1 in the active area, and by disposing a plurality of the second dummy lines on the extension lines of the fan-out lines, the distribution density of the wirings in the active area is improved, thereby improving the problem of uneven display when the display panel is power off due to uneven distribution of metal patterns.

Optionally, in order to solve the display quality problem of the display panel affected by serious capacitive coupling effects when the first dummy lines Du1 and the second dummy lines float, a plurality of the first dummy lines Du1 can be connected to a first power source, and a plurality of the second dummy lines can be connected to a second power source, so that a plurality of the first dummy lines Du1 and a plurality of the second dummy lines are inputted with relatively stable electric potentials at a specific time, thereby improving the display quality problem of the display panel affected by serious capacitive coupling effects. Optionally, the first power source can be a DC power source or an AC power source, the second power source can be a DC power supply (including a DC low power source and a DC high power source) or an AC power source. Optionally, a plurality of the first dummy lines Du1 can be connected to the first power sources of different types (such as DC power source or AC power source) and different amplitudes (such as different voltage values or different active pulse amplitudes), a plurality of the second dummy lines can be connected to the second power source of different types or different amplitudes, so as to improve the uneven display quality in different areas of the active area caused by different capacitive coupling effects.

Optionally, refer to FIGS. 3A-3C, each of the fan-out lines includes a first sub lines Fa1 and a second sub lines Fa2 electrically connected to the first sub lines Fa1, and a plurality of the dummy lines include a plurality of first sub dummy lines Du21 and a plurality of second sub dummy lines Du22.

The first sub lines Fa1 extend along a first direction x, the second sub lines Fa2 extend along a second direction y intersecting the first direction x, each of the first sub dummy lines Du21 is disposed on an extension line of the corresponding first sub line Fa1, and each of the second sub dummy lines Du22 is disposed on an extension line of the corresponding second sub line Fa2.

Since each of the fan-out lines includes a first sub line Fa1 and a second sub line Fa2 electrically connected to the first sub line Fa1, the data lines and the driving module are electrically connected. Since each of the first sub dummy lines Du21 is disposed on the extension line of the corresponding first sub line Fa1, and each of the second sub dummy lines Du22 is disposed on the extension line of the corresponding second sub line Fa2, the distribution density of the wirings in the active area tends to be consistent, thereby improving the problem of uneven display of the display panel when the display panel is power off.

Optionally, a plurality of the data lines further include a plurality of second data lines DL2, a plurality of the second data lines DL2 are alternately spaced from a plurality of the second sub dummy lines Du22, so that the pattern distribution formed by a plurality of the second data lines DL2, a plurality of the second sub dummy lines Du22 and a plurality of the second sub lines Fa2 in the active area is similar to the pattern distribution of a plurality of the first data lines DL1 and a plurality of the first dummy lines Du1, which improves the distribution density of metal patterns in the active area, thereby improving the problem of uneven display of the display panel when the display panel is power off.

Optionally, the distance between two adjacent first data lines DL1 is equal to the distance between two adjacent first dummy lines Du1. The distance between two adjacent second data lines DL2 is equal to the distance between two adjacent second sub dummy lines Du22, so that the distribution of a plurality of wirings disposed in the active area tends to be uniform, which is conducive to improving the problem of uneven display of the display panel when the display panel is power off.

Optionally, a plurality of the first sub lines Fa1 and a plurality of the second sub lines Fa2 are disposed in different layers. Optionally, a plurality of the first data lines DL1, a plurality of the second data lines DL2, a plurality of the first dummy lines Du1, a plurality of the second sub dummy lines Du22 and a plurality of the second sub lines Fa2 can be made of different materials and disposed in a same layer or can be made of a same material and disposed in a same layer, so that the distribution density of the metal pattern formed by a plurality of wirings disposed in the same layer is uniform, which is conducive to improving the problem of uneven display of the display panel when the display panel is power off.

Optionally, a plurality of the first sub lines Fa1 and a plurality of the first sub dummy lines Du21 can be made of different materials and disposed in a same layer or can be made of a same material and disposed in a same layer, so that the distribution density of the metal pattern formed by the plurality of wirings disposed in the same layer is uniform, which is conducive to improving the problem of uneven display of the display panel when the display panel is power off.

Optionally, the display panel includes a first metal layer 101 and a second metal layer 102.

The first metal layer 101 includes a plurality of the data lines, a plurality of the second sub lines Fa2, a plurality of the first dummy lines Du1 and a plurality of the second sub dummy lines Du22.

The second metal layer 102 is disposed on one side of the first metal layer 101, and the second metal layer 102 includes a plurality of the first sub lines Fa1 and a plurality of the first sub dummy lines Du21.

Optionally, the first metal layer 101 and the second metal layer 102 can include at least one of molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), copper (Cu), etc., respectively. Optionally, the first metal layer 101 and the second metal layer 102 can be a single-layer structure, or a laminated structure such as Ti/Al/Ti, Mo/Al/Mo, Mo/AlGe/Mo, Cu/Mo, Cu/Ti, Cu/MoTi, Cu/MoNb, etc., respectively.

Optionally, refer to FIG. 2B, the display panel further includes an interlayer dielectric layer 103 and a first planarization layer 104, the first metal layer 101 is disposed on the interlayer dielectric layer 103, the first planarization layer 104 is disposed on the first metal layer 101, and the second metal layer 102 is disposed on the first planarization layer 104.

Optionally, the first sub line Fa1 is electrically connected to the data line through a first via hole through the first planarization layer 104, and the first sub line Fa1 is electrically connected to the second sub line Fa2 through a second via hole through the first planarization layer 104.

Optionally, the display panel further includes a substrate 105, an active layer 106, a first gate layer 107, a first gate insulating layer 108, a second gate layer 109, and a second planarization layer 111.

The substrate 105 includes a rigid substrate or a flexible substrate. Optionally, the substrate 105 includes glass, polyimide, etc.

The active layer 106 is disposed on the substrate 105, the first gate insulating layer 108 is disposed between the active layer 106 and the first gate layer 107, the second gate insulating layer 110 is disposed between the first gate layer 107 and the second gate layer 109, the interlayer dielectric layer 103 is disposed on the second gate layer 109, and the second planarization layer 111 is disposed on the second metal layer 102.

Optionally, the active layer 106 includes a silicon semiconductor material, an oxide semiconductor material, etc. Optionally, the silicon semiconductor material includes monocrystalline silicon, polysilicon, etc. The oxide semiconductor material can include indium gallium zinc oxide (IGZO), indium gallium tin oxide (IGTO), indium gallium zinc tin oxide (IGZTO), etc. Optionally, the active layer 106 is made using a low temperature polysilicon process.

Optionally, the first gate insulating layer 108, the second gate insulating layer 110, and the interlayer dielectric layer 103 can include a silicon oxide, a silicon nitride, a silicon nitride, an aluminum oxide, a tantalum oxide, a hafnium oxide, a zirconium oxide, a titanium oxide, etc.

Optionally, the first gate layer 107 and the second gate layer 109 can respectively include at least one of molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), copper (Cu), etc.

Optionally, the display panel further includes a plurality of sub pixels Pi and a plurality of pixel driving units Dr configured to drive a plurality of the sub pixels Pi to emit light. Optionally, the sub pixel Pi includes a light emitting device. The light emitting device includes an organic light emitting diodes, a sub millimeter light emitting diodes, a micro light emitting diodes, etc.

Optionally, the light emitting device includes a first electrode disposed on the second planarization layer 111, the first electrode is electrically connected to the pixel driving unit Dr through a via hole through the second planarization layer 111.

Optionally, the display panel further includes a buffer layer 112 and a barrier layer, etc., disposed between the substrate 105 and the active layer 106.

Optionally, refer to FIGS. 2A and 3A-3C, the active area includes a main active area 100*d* and a first active area 100*a*, a second active area 100*b*, and a third active area 100*c* disposed on one side of the main active area 100*d*. The second active area 100*b* is disposed between the first active area 100*a* and the third active area 100*c*.

Optionally, a driving module configured to supply data signals to the display panel is disposed in a lower border area of the display panel, and the first active area 100*a*, the second active area 100*b*, and the third active area 100*c* are disposed on one side of the main active area 100*d* close to the lower border area of the display panel.

Optionally, a plurality of the first data lines DL1 and a plurality of the first dummy lines Du1 extend from the first active area 100*a* toward the second active area 100*b* and the main active area 100*d* along the second direction y. A plurality of the second data lines DL2 extend from the third active area 100*c* toward the second active area 100*b* and the main active area 100*d* along the second direction y. A plurality of the first sub lines Fa1 are disposed in the second active area 100*b*, and a plurality of the second sub lines Fa2 are disposed in the third active area 100*c*. A plurality of the first sub dummy lines Du21 are disposed in the first active area 100*a* and the third active area 100*c*, and a plurality of the second sub dummy lines Du22 extend from the second active area 100*b* to the main active area 100*d* along the second direction y. By connecting a plurality of the first data lines DL1 to the second sub lines Fa2 disposed in the third active area 100*c* and the first sub lines Fa1 disposed in the second active area 100*b*, the distribution area of a plurality of the fan-out lines are reduced, which is conducive to realizing the narrow frame design of the display panel.

Optionally, the first active area 100*a* can correspond to an active area of the display panel having an arc boundary. Optionally, the distance between the first center line passing through the center of the display panel and extending along the second direction y and the third active area 100*c* is greater than the distance between the first center line and the first active area 100*a*. By electrically connecting a plurality of the first data lines DL1 corresponding to an active area having an arc boundary of the display panel to the second sub lines Fa2 disposed in the third active area 100*c* and the first sub lines Fa1 disposed in the second active area 100*b*, to receive the data signals provided by the driving module, the fan-out wirings width of a plurality of the fan-out lines in the lower frame area can be reduced, thereby reducing the wirings space occupied by a plurality of the fan-out lines in the lower frame area, which is conducive to realizing the narrow frame design of the display panel.

Optionally, lengths of a plurality of the second sub lines Fa2 are gradually increased along a direction of the first active area 100*a* toward the third active area 100*c*. Lengths of a plurality of the first sub lines Fa1 are gradually increased along the direction of the second active area 100*b* toward the main active area 100*d*. The distance between a plurality of the first data lines DL1 electrically connected to the plurality of second sub lines Fa2 whose lengths are gradually increased and the third active area 100*c* gradually increase along a direction of the first active area 100*a* toward the third active area 100*c*, so that the first data lines DL1 disposed in the first active area 100*a* farther from the third active area 100*c* are electrically connected to the second sub lines Fa2 disposed in the third active area 100*c* farther from the first active area 100*a*, so that the first data lines DL1 disposed in the first active area 100*a* closer to the third active area 100*c* are electrically connected to the second sub lines Fa2 disposed in the third active area 100*c* closer to the first active area 100*a*, thereby reducing the wiring space occupied by a plurality of fan-out lines in the frame area, which is conducive to realizing the narrow frame design of the display panel.

Optionally, the second active area 100*b* includes a first sub active area 1001*b* and a second sub active area 1002*b* adjacent to the first sub active area 1001*b*, the first sub active area 1001*b* is disposed between the second sub active area 1002*b* and the first active area 100*a*. A plurality of the first data lines DL1 and a plurality of the first dummy lines Du1 extend from the first active area 100*a* toward the first sub active area 1001*b* and the main active area 100*d* along the second direction y. A plurality of the second data lines DL2 extend from the third active area 100*c* toward the second sub active area 1002*b* and the main active area 100*d* along the second direction y. A plurality of the second sub dummy lines Du22 extend from the second sub active area 1002*b* toward the main active area 100*d* along the second direction y. By providing the first sub active area 1001*b* and the second sub active area 1002*b* with different wirings, the display panel can be designed to improve the problem of uneven display of the display panel when the display panel is power off.

Optionally, each of the first sub dummy lines Du21 disposed in the first active area 100*a* and the corresponding first sub line Fa1 form a first interval at a first boundary B1 of the first active area 100*a* and the second active area 100*b*, each of the first sub dummy lines Du21 and the corresponding first sub line Fa1 disposed in the third active area 100*c* form a second interval at the second boundary B2 of the second active area 100*b* and the third active area 100*c*, and each of the second sub dummy lines Du22 and the corresponding second sub line Fa2 form a third interval at the second boundary B2. An included angle pattern formed by the intersection of the first boundary B1 and the second boundary B2 is opposite to the main active area 100*d*. By forming intervals between a plurality of the fan-out lines and the corresponding second dummy lines, interference of signals transmitted on the second dummy lines to data signals transmitted on the fan-out lines is reduced.

Optionally, in order to reduce the impact on the display effect of the display panel caused by the first interval, the second interval and the third interval, the first interval, the second interval and the third interval can be equal to the minimum interval that can be supported in the manufacturing process. For example, the first interval, the second interval and the third interval can be less than or equal to 3 microns, respectively.

Optionally, a plurality of the dummy lines further includes a plurality of third dummy lines Du3 disposed in the main active area 100*d* and extending along the first direction x. Each of the third dummy lines Du3 is partially overlapped with a plurality of the first data lines DL1, a plurality of the second data lines DL2, a plurality of the first dummy lines Du1 and a plurality of the second sub dummy lines Du22, so that the dummy lines are uniformly distributed throughout the active area, thereby improving the problem of uneven display of the display panel when the display panel is power off.

Optionally, a plurality of the third dummy lines Du3, a plurality of the first sub dummy lines Du21 and a plurality of the first sub lines Fa1 are made of different materials and disposed in a same layer or made of a same material and disposed in a same layer, so that a plurality of the first sub dummy lines Du21, a plurality of the first sub lines Fa1 and a plurality of the third dummy lines Du3 are uniformly distributed in the active area.

Optionally, a distance between two of the adjacent third dummy lines Du3 is the same as the distance between two adjacent first sub lines Fa1, so that the distribution density of a plurality of the third dummy lines Du3 is close to the distribution density of the plurality of first sub lines Fa1.

Figure 4:
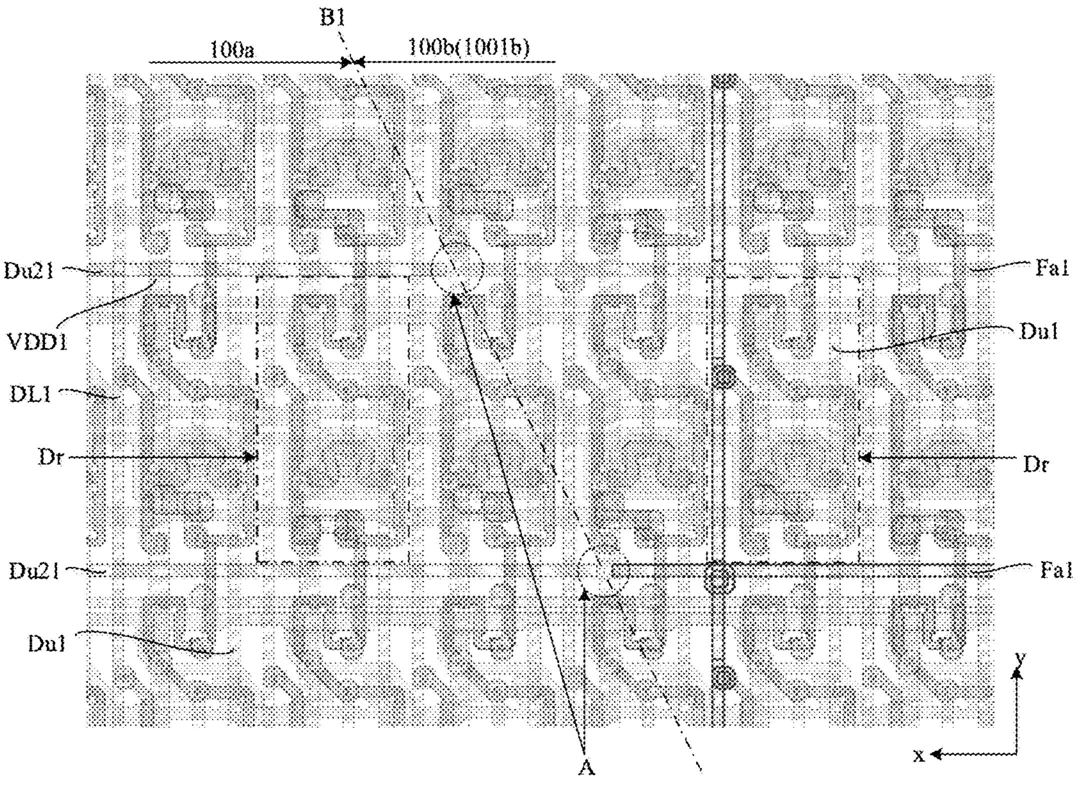
FIG. 4 is a structural schematic diagram of a first active area and a second active area provided in the embodiments of the present application.

FIG. 4 is a structural schematic diagram of the first active area 100*a* and the second active area 100*b* provided in the embodiments of the present application. The display panel further includes a plurality of first power lines VDD1, each of the first power lines VDD1 is disposed between one of the first data lines DL1 and one of the first dummy lines Du1 and extends along the second direction y. The orthographic projection of each of the first intervals on the corresponding first power line VDD1 at least partially overlaps with the first power line VDD1 (as shown in A of FIG. 4) to reduce the impact on the display effect of the display panel caused by the first intervals.

Figure 5:
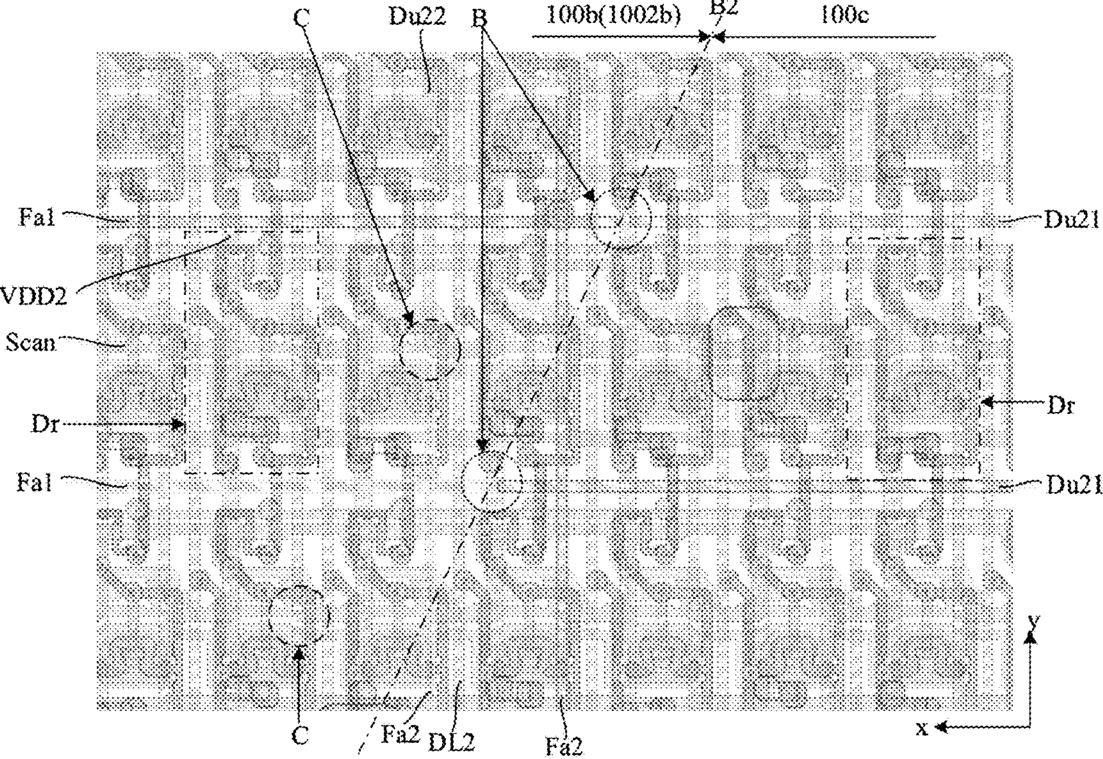
FIG. 5 is a structural schematic diagram of a second active area and a third active area provided in the embodiments of the present application.

FIG. 5 is a structural schematic diagram of the second active area 100*b* and the third active area 100*c* provided in the embodiments of the present application. The display panel further includes a plurality of second power lines VDD2, each of the second power lines VDD2 is disposed between one of the second data lines DL2 and one of the second sub dummy lines Du22 and extends along the second direction y. The orthographic projection of each of the second intervals on the corresponding second power line VDD2 at least partially overlaps with the second power line VDD2 (as shown in B of FIG. 5) to reduce the impact on the display effect of the display panel caused by the second intervals.

Optionally, the display panel includes a plurality of first scanning lines Scan disposed in the active area and extending along the first direction x. The orthographic projection of each of the third intervals on the corresponding first scanning line Scan at least partially overlaps with the first scanning line Scan (as shown in C of FIG. 5) to reduce the impact on the display effect of the display panel caused by the third intervals.

Optionally, at least one of a plurality of the first intervals, a plurality of the second intervals and a plurality of the third intervals can also partially overlap with the first electrodes of the sub pixels Pi, so that the first interval, the second interval and the third interval are shielded by the sub pixels, thereby reducing the impact on the display effect of the display panel caused by the first interval, the second interval and the third interval.

Optionally, a plurality of the first dummy lines Du1 can be electrically connected to the first power supply lines VDD1, so that the first dummy lines Du1 are not in a floating state, thereby improving the impact of a large capacitive coupling caused by the first dummy lines Du1 on the display quality of the display panel.

Optionally, a plurality of the second dummy lines can be electrically connected to the first power supply lines VDD1 and/or the second power supply lines VDD2, so that the second dummy lines are not in a floating state, thereby improving the impact of large capacitive coupling caused by the second dummy lines on the display quality of the display panel.

Refer to FIGS. 4 to 5, a plurality of pixel driving units Dr are electrically connected to a plurality of first power lines VDD1, a plurality of second power lines VDD2, a plurality of first scanning lines Scan, and a plurality of sub pixels Pi. At least one of the first sub lines Fa1 is disposed between two of the adjacent pixel driving units Dr along the second direction y. A plurality of the pixel driving units Dr and a plurality of the first sub lines Fa1 are uniformly distributed in the active area while reducing the probability of problems such as short circuit, parasitic capacitance, etc., in the wirings of the first sub lines Fa1 and the pixel driving unit Dr, which is conducive to improving the problem of uneven display of the display panel when the display panel is power off.

Refer to FIG. 4 to FIG. 5, the display panel includes a plurality of pixels. Optionally, each of the pixels includes at least two sub pixels Pi. Optionally, the sub pixels Pi included in each of the pixels can be disposed in a standard RGB arrangement, a pearl arrangement, etc.

Optionally, refer to FIG. 4, a first data line DL1, a first power line VDD1 and a first dummy line Du1 extending along the second direction y are disposed in an area of the first active area 100*a* corresponding to at least one of the pixel driving units Dr, and the first power line VDD1 is disposed between the first data line DL1 and the first dummy line Du1.

Optionally, refer to FIG. 4, a first data line DL1, a first power line VDD1 and a first dummy line Du1 extending along the second direction y are disposed in an area of the first sub active area 1001*b* corresponding to at least one of the pixel driving units Dr.

Optionally, refer to FIG. 4 and FIG. 5, a second data line DL2, a second power line VDD2, a second sub dummy line Du22 and/or a second sub line Fa2 extending along the second direction y are disposed in an area of the second sub active area 1002*b* corresponding to at least one of the pixel driving units Dr.

Optionally, refer to FIG. 4 and FIG. 5, a second data line DL2, a second power line VDD2 and a second sub line Fa2 extending along the second direction y are disposed in an area of the third active area 100*c* corresponding to at least one of the pixel driving units Dr.

Optionally, a first data line DL1, a first power line VDD1 and a first dummy line Du1 extending along the second direction y are disposed in an area of the main active area 100*d* corresponding to at least one of the pixel driving units Dr. Or a second data line DL2, a second power line VDD2 and a second sub dummy line Du22 extending along the second direction y are disposed in an area of the main active area 100*d* corresponding to at least one of the pixel driving units Dr.

Optionally, the active area can also include a fourth active area 100*e* disposed on one side of the third active area 100*c* farther from the second active area 100*b*. The display panel also includes a plurality of third data lines and a plurality of fourth dummy lines. A plurality of the third data lines are alternately spaced from a plurality of the fourth dummy lines. A plurality of the third data lines and a plurality of the fourth dummy lines extend from the fourth active area 100*e* to the main active area 100*d* along the second direction y, so that the wiring density of the fourth active area 100*e* and the wiring density of the main active area 100*d* tend to be consistent, which is conducive to improving the problem of uneven display of the display panel when the display panel is power off.

By uniformly distributing a plurality of the first data lines DL1, a plurality of the first dummy lines Du1, a plurality of the second sub lines Fa2 and a plurality of the second sub dummy lines Du22 in the active area, a plurality of the first sub lines Fa1, a plurality of the first sub dummy lines Du21 and a plurality of the third dummy lines Du3 are uniformly distributed in the active area, and the first intervals, the second intervals and the third intervals are partially shielded by the corresponding first power lines VDD1, the second power lines VDD2 and the first scanning lines Scan, respectively, therefore, the wirings difference can be adjusted. A test result on the products made from the technical solutions of the present application proves that the problem of uneven display of the display panel can be improved and the obvious problem of uneven display of the display panel no longer exists.

In addition, since the first dummy lines Du1 in the embodiments of the present application have a design similar to that of the first data lines DL1 (that is, both of them are designed as wirings extending along the second direction y), the second dummy lines have a design similar to that of the fan-out lines (that is, the second dummy line is a wiring disposed on an extension line of the fan-out line), so that the design form of the dummy lines described in the present application is simpler, which is conducive to reducing the requirements for equipment used in the manufacturing process, thereby saving the manufacturing cost and meeting the manufacturing accuracy requirements easily, and it is also conducive to saving wirings space of the display panel, so that the display panel can integrate more functions.

Figure 6:
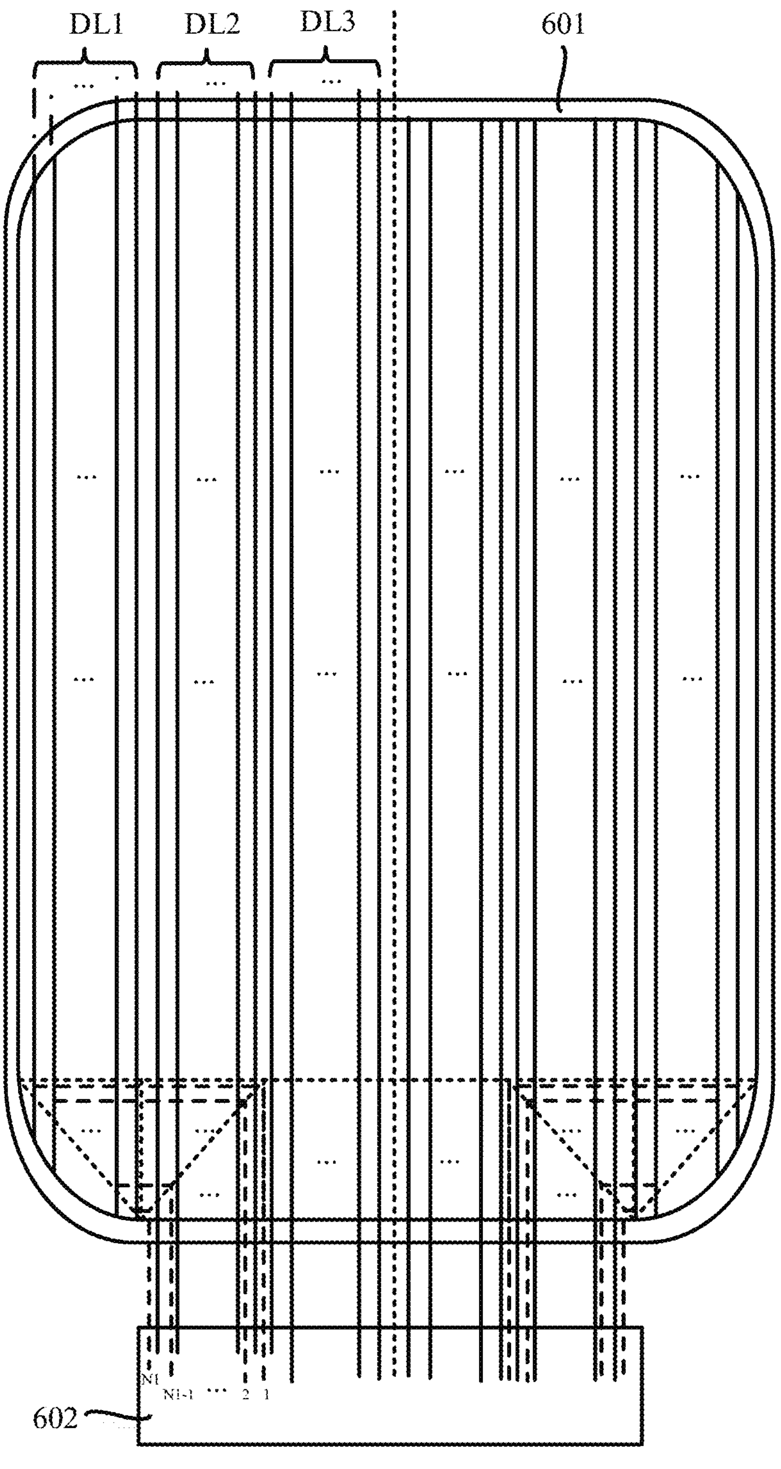
FIG. 6 is a structural schematic diagram of the display device provided in the embodiments of the present application.

FIG. 6 is a structural schematic diagram of the display device provided in the embodiments of the present application. The present application also provides a display device including any of the above-mentioned display panels (such as the display panel 601 shown in FIG. 6) and a driving module 602. The driving module 602 is electrically connected to the display panel 601 and is configured to provide a plurality of data signals to a plurality of the data lines.

Optionally, the driving module 602 includes a plurality of output terminals electrically connected to a plurality of the data lines. Each of the output terminals is configured to output one of the data signals.

Optionally, a plurality of the first data lines DL1 are arranged in a first order, and a plurality of the first output terminals of a plurality of the output terminals electrically connected to a plurality of the first data lines DL1 in sequence are arranged in a second order, the first order and the second order are different. That is, a plurality of data signals outputted from the driving module are out of order, so as to match the design of the data lines, the dummy lines and the fan-out lines in the display panel, and to further reduce the regional difference of the metal pattern density in the active area, thereby improving the problem of uneven display of the display panel.

Assume that the driving module 602 includes M output terminals, if a plurality of the data signals are sequentially outputted, the first data signals outputted by the first output terminal are transmitted to the first data line in the active area through the corresponding fan-out line, the second data signals outputted by the second output terminal are transmitted to the second data line in the active area through the corresponding fan-out line, and the Mth data signals outputted by the Mth output terminal are transmitted to the Mth data line in the active area through the corresponding fan-out line. And if a plurality of the data signals are outputted out of order, the first data signals outputted by the n1 th output terminal are transmitted to the first data line in the active area through the corresponding fan-out line, the second data signals outputted from the n2 th output terminal are transmitted to the second data line in the active area through the corresponding fan-out line, and the M th data signals outputted from the nmth output terminal are transmitted to the m th data line in the active area through the corresponding fan-out line. $n1 \neq n2 \neq \ldots \neq nm$, $1 \leq n1 \leq M$, $1 \leq n2 \leq M$, . . . , $1 \leq nm \leq M$.

For example, refer to FIG. 6, along the direction from the first active area 100*a* to the third active area 100*c*, a plurality of the first data lines DL1 are arranged in the order of 1, 2, . . . , N1, a plurality of the second data lines DL2 are arranged in the order of N1+1, N1+2, . . . , N2, and a plurality of the third data lines DL3 are arranged in the order of N2+1, N2+2, . . . , N3. Along the direction from the leftmost side to the rightmost side of the display panel, a first output terminal of the plurality of output terminals outputs an N1+1 th data signal to an N1+1 th data line (that is, the second data line DL2), a second output terminal outputs the N1 th data signal to the N1 th data line (that is, the first data line DL1), a third output terminal outputs an N1+2 th data signal to an N1+2 th data line (that is, the second data line DL2), a fourth output terminal outputs an N1−1 th data signal to an N1−1 th data line (that is, the first data line DL1), . . . , the N2−1 th output terminal outputs an N2 th data signal to an N2 data line (that is, the second data line DL2), and the N2 th output terminal outputs a first data signal to a first data line (that is, the first data line DL1), an N2+1 th output terminal outputs the N2+1 th data signal to the N2+1 th data line (that is, the third data line), the N2+2 th output terminal outputs the N2+2 th data signal to the N2+2 th data line (that is, the third data line), and the N3 th output terminal outputs the N3 th data signal to the N3 th data line (that is, the third data line). Thus, along the direction from the first active area 100*a* to the third active area 100*c*, data signals outputted from a plurality of first output terminals electrically connected to the plurality of first data lines DL1 are arranged in the order of N1, N1−1, . . . , and 1, which is different from the arrangement order of 1, 2, . . . , N1 of a plurality of the first data lines DL1.

The display device of the present application can be a movable display device (such as notebook computer, mobile phone, etc.), a fixed terminal (such as desktop computer, TV, etc.), a measuring device (such as sports bracelet, thermometer, etc.), etc.

Specific embodiments are applied herein to describe the principle and implementation method of the present application, and the above description of the embodiments is only used to help understand the method and its core idea of the present application. Meanwhile, changes on the specific implementation method and application scope of the present application made by those skilled in the art based on the idea of the present application are allowable and the content of the present specification should not be considered as a limitation to the protection scope of the present application.

What is claimed is:

1. A display panel comprising an active area, wherein the display panel comprises:

a plurality of data lines disposed in the active area and comprising a plurality of first data lines; and a plurality of fan-out lines disposed in the active area and being electrically connected to a plurality of the first data lines;

wherein the display panel further comprises a plurality of dummy lines being disposed in the active area, the dummy lines comprise a plurality of first dummy lines being alternately spaced from a plurality of the first data lines and a plurality of second dummy lines being disposed on extension lines of a plurality of the fan-out lines;

wherein each of the fan-out lines comprises a first sub line and a second sub line electrically connected to the first sub line, and a plurality of the dummy lines comprises a plurality of first sub dummy lines and a plurality of second sub dummy lines;

wherein the first sub lines extend along a first direction, the second sub lines extend along a second direction intersecting the first direction, each of the first sub dummy lines being disposed on an extension line of the corresponding first sub line, and each of the second sub dummy lines being disposed on an extension line of the corresponding second sub line;

wherein a plurality of the data lines further comprises a plurality of second data lines, and a plurality of the second data lines being alternately spaced from a plurality of the second sub dummy lines;

wherein the active area comprises a main active area and a first active area, a second active area and a third active area being disposed on one side of the main active area, the second active area being disposed between the first active area and the third active area;

wherein a plurality of the first data lines and a plurality of the first dummy lines extend from the first active area toward the second active area and the main active area along the second direction, a plurality of the second data lines extend from the third active area toward the second active area and the main active area along the second direction;

wherein a plurality of the first sub lines being disposed in the second active area, and a plurality of the second sub lines being disposed in the third active area;

wherein a plurality of the first sub dummy lines being disposed in the first active area and the third active area, and a plurality of the second sub dummy lines extend from the second active area toward the main active area along the second direction.

2. The display panel of claim 1, wherein the display panel comprises:

a first metal layer comprising a plurality of data lines, a plurality of second sub lines, a plurality of first dummy lines and a plurality of second sub dummy lines; and a second metal layer disposed at one side of the first metal layer and comprising a plurality of the first sub lines and a plurality of the first sub dummy lines.

3. The display panel of claim 1, wherein the second active area comprises a first sub active area and a second sub active area adjacent to the first sub active area, the first sub active area being disposed between the second sub active area and the first active area;

wherein a plurality of the first data lines and a plurality of the first dummy lines extend from the first active area toward the first sub active area and the main active area along the second direction, a plurality of the second data lines extend from the third active area toward the second sub active area and the main active area along the second direction, a plurality of the second sub dummy lines extend from the second sub active area toward the main active area along the second direction.

4. The display panel according to claim 1, wherein each of the first sub dummy lines disposed in the first active area and the corresponding first sub line form a first interval at a first boundary of the first active area and the second active area, each of the first sub dummy lines disposed in the third active area and the corresponding first sub line form a second interval at a second boundary of the second active area and the third active area, and each of the second sub dummy lines and the corresponding second sub line form a third interval at the second boundary;

wherein an included angle pattern formed by the intersection of the first boundary and the second boundary faces to the main active area.

5. The display panel of claim 4, wherein the display panel further comprises:

a plurality of first power lines, each of the first power lines being disposed between one of the plurality of first data lines and one of the plurality of first dummy lines and extends along the second direction;

a plurality of second power lines, each of the second power lines being disposed between one of the plurality of second data lines and one of the plurality of second sub dummy lines and extends along the second direction; and, a plurality of first scanning lines disposed in the active area and extending along the first direction;

wherein an orthographic projection of each of the first intervals on a corresponding first power line being at least partially overlapped with the first power line, an orthographic projection of each of the second intervals on a corresponding second power line being at least partially overlapped with the second power line, and an orthographic projection of each of the third intervals on a corresponding first scanning line being at least partially overlapped with the first scanning line.

6. The display panel according to claim 5, wherein a plurality of the first dummy lines being electrically connected to the first power supply lines, and a plurality of the second dummy lines being electrically connected to the first power supply lines and the second power supply lines.

7. The display panel of claim 5, wherein the display panel further comprises:

a plurality of sub pixels; and a plurality of pixel driving units electrically connected to a plurality of first power lines, a plurality of second power lines, a plurality of first scanning lines and a plurality of sub pixels;

wherein at least one of the first sub lines being disposed between the two adjacent pixel driving units along the second direction.

8. The display panel of claim 7, wherein at least one of a plurality of the first intervals, a plurality of the second intervals, and a plurality of the third intervals being partially overlapped with a first electrode portion of the sub pixel.

9. The display panel of claim 1, wherein the dummy lines further comprise a plurality of third dummy lines being disposed in the main active area and extend along the first direction;

wherein each of the third dummy lines being partially overlapped with a plurality of the first data lines, a plurality of the second data lines, a plurality of the first dummy lines and a plurality of the second sub dummy lines.

10. The display panel of claim 1, wherein the first data lines in the first active area farther from the third active area being electrically connected to the second sub lines in the third active area farther from the first active area.

11. A display device comprising a driving module and the display panel as claimed in claim 1, wherein the driving module comprises a plurality of output terminals, a plurality of the output terminals being electrically connected to a plurality of the data lines;

wherein a plurality of the first data lines being arranged in a first sequence, data signals outputted from a plurality of first output terminals electrically connected to a plurality of the first data lines being arranged in a second sequence, wherein the first sequence being different from the second sequence.

12. The display device of claim 11, wherein the display panel comprises:

a first metal layer comprising a plurality of the data lines, a plurality of second sub lines, a plurality of first dummy lines and a plurality of second sub dummy lines; and a second metal layer disposed at one side of the first metal layer and comprising a plurality of the first sub lines and a plurality of the first sub dummy lines.

13. The display device according to claim 11, wherein a plurality of the dummy lines further comprises a plurality of third dummy lines, a plurality of the third dummy lines being disposed in the main active area, each of the third dummy lines extends along the first direction and being partially overlapped with a plurality of the first data lines, a plurality of the second data lines, a plurality of the first dummy lines and a plurality of the second sub dummy lines.

14. The display device according to claim 13, wherein each of the first sub dummy lines disposed in the first active area and the corresponding first sub line form a first interval at a first boundary of the first active area and the second active area, each of the first sub dummy lines disposed in the third active area and the corresponding first sub line form a second interval at a second boundary of the second active area and the third active area, and each of the second sub dummy lines and the corresponding second sub line form a third interval at the second boundary;

wherein an included angle pattern formed by the intersection of the first boundary and the second boundary faces to the main active area.

15. The display device of claim 14, wherein the display panel further comprises:

a plurality of first power lines, each of the first power lines being disposed between the first data line and the first dummy line and extends along the second direction;

a plurality of second power lines, each of the second power lines being disposed between the second data line and the second sub dummy line and extends along the second direction; and, a plurality of first scanning lines disposed in the active area and extending along the first direction;

wherein an orthographic projection of each of the first intervals on a corresponding first power line being at least partially overlapped with the first power line, an orthographic projection of each of the second intervals on a corresponding second power line being at least partially overlapped with the second power line, and an orthographic projection of each of the third intervals on a corresponding first scanning line being at least partially overlapped with the first scanning line.

16. The display device of claim 15, wherein the display panel further comprises:

a plurality of sub pixels; and a plurality of pixel driving units electrically connected to a plurality of first power lines, a plurality of second power lines, a plurality of first scanning lines and a plurality of sub pixels;

wherein at least one of the first sub lines being disposed between the two adjacent pixel driving units along the second direction.

* * * * *